United States Patent

Iravani

Patent Number: 5,977,800
Date of Patent: Nov. 2, 1999

[54] DIFFERENTIAL MOS CURRENT-MODE LOGIC CIRCUIT HAVING HIGH GAIN AND FAST SPEED

[75] Inventor: Kamran Iravani, San Jose, Calif.

[73] Assignee: VLSI Technology, Inc., San Jose, Calif.

[21] Appl. No.: 08/955,012

[22] Filed: Oct. 20, 1997

[51] Int. Cl.$^6$ .................................................. H03K 19/094
[52] U.S. Cl. ........................... 326/115; 326/119; 326/121
[58] Field of Search .................................... 326/112, 115, 326/118, 119, 122, 17, 83; 327/52, 65, 563

[56] References Cited

U.S. PATENT DOCUMENTS

4,074,150  2/1978  Buckley, III et al. .................. 307/326

*Primary Examiner*—Michael Tokar
*Assistant Examiner*—Ahn Q Tran
*Attorney, Agent, or Firm*—Wagner, Murabito & Hao LLP

[57] ABSTRACT

The differential MOS current-mode logic structure of the present invention is comprised of a differential MOS transistor pair and a complementary MOS (CMOS) transistor for each of the transistors comprising the differential MOS pair. The gates of the CMOS transistors are coupled to the gates of the differential MOS pair. Since the gates of the differential MOS pair receive a differential signal from the inputs, the voltage between the gate and the source, Vgs, for each of the transistors comprising the MOS differential pair is not fixed. As a result, the gain of the CMOS current-mode logic structure of the present invention is high. In addition, since the gates of the CMOS transistors are coupled to the gates of the differential MOS pair, the current for the CMOS transistors is increased when charging the node capacitance and is decreased when discharging the node capacitance. Hence, the present invention allows faster charging and discharging of transistors, which results in faster switching transistors and higher speed circuit.

19 Claims, 6 Drawing Sheets

DIFFERENTIAL MOS CURRENT-MODE LOGIC CIRCUIT HAVING HIGH GAIN AND FAST SPEED

FIELD OF THE INVENTION

The present claimed invention relates to the field of MOS logic circuits. More particularly, the present claimed invention relates to high speed and gain differential MOS current-mode logic circuits.

BACKGROUND ART

Metal-oxide-semiconductor (MOS) circuits are widely used in digital large scale integration (LSI) design for digital circuits such as microprocessor and memory circuits. In comparison to bipolar circuits, the MOS circuits allow a more efficient fabrication of transistors on integrated circuit chips. This is because an MOS transistor generally takes up less chip area than a bipolar junction transistor, which means that more transistors can be included in a chip. Consequently, more circuit functions can be performed on the chip with MOS circuits.

One of the most basic digital logic circuits utilizing MOS technology is the conventional inverter. Inverter circuits are so fundamental that, in fact, most MOS logic gates and circuits are derived from the MOS inverter. For instance, logic gates such as AND, NAND, OR, and NOR gates are typically built using the MOS inverters as the basic structure.

These traditional MOS digital logic circuits however, typically suffer from adverse switching noise from individual transistors fabricated onto the integrated circuit chips. In an effort to alleviate the noise problem in MOS integrated circuit chips, prior art MOS logic circuits have been implemented in current-mode structures. The current-mode circuits have the advantage of low digital noise characteristics. For example, in MOS current-mode, the digital switching noise generated by current-mode logic is typically two orders of magnitude smaller than in conventional MOS logic circuits. More background details on current-mode circuits are available from the following publications which are incorporated herein by this reference: Sailesh R. Maskai, et al., Synthesis Techniques for CMOS Folded Source-Coupled Logic Circuits, IEEE Journal of Solid-State Circuits, Vol. 27, No. 8, August 1992; Sayfe Kiaei, et al., CMOS Source-Coupled Logic for Mixed-Mode VLSI, IEEE 1990; and Masayuki Mizuno, et al., A GHz MOS Adaptive Pipeline Technique Using MOS Current-Mode Logic, IEEE Journal of Solid-State Circuits, Vol. 31, No. 6, June 1996.

Figure 1A:
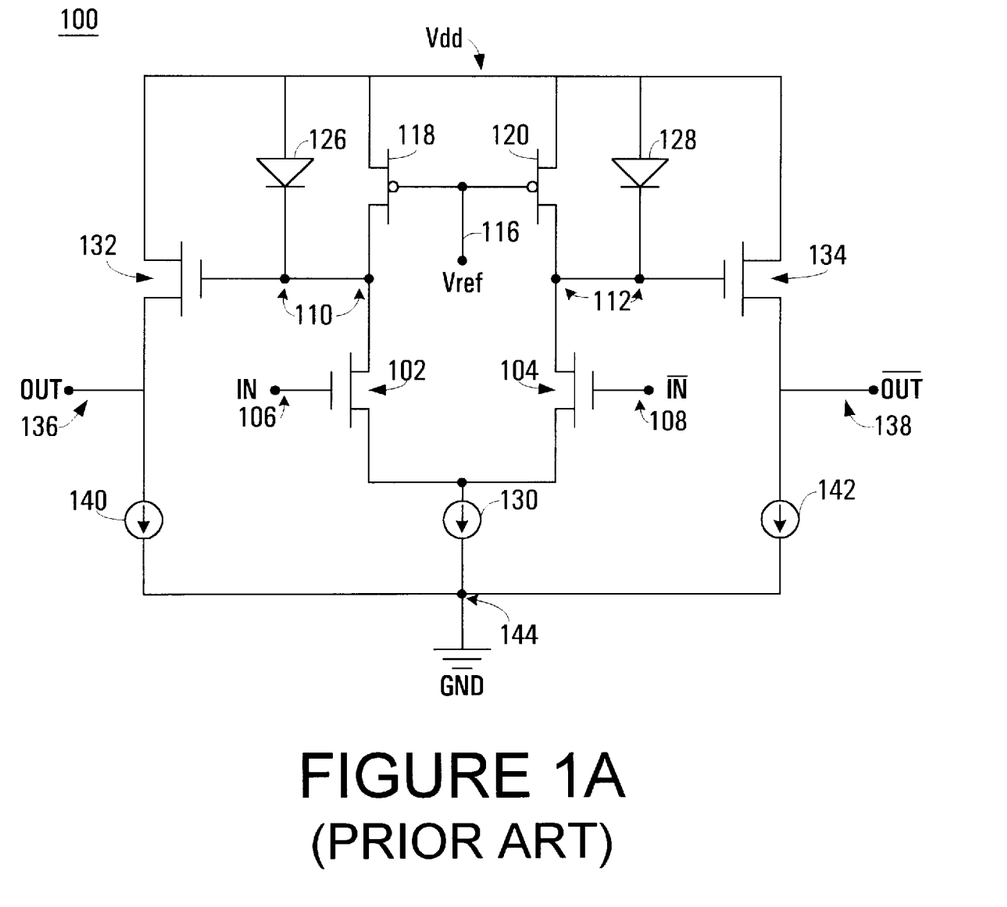
FIG. 1A illustrates a conventional differential MOS current-mode logic inverter.

Due to the low noise characteristics of current-mode structures, integrated circuit chips are increasingly implementing the MOS current-mode logic circuits. Prior Art FIG. 1A illustrates a conventional differential MOS current-mode logic inverter 100. In this inverter circuit 100, a differential pair includes a pair of n-type MOS transistors 102 and 104 coupled to each other on their source terminals. A pair of p-type (e.g., complementary) MOS transistors 118 and 120 are coupled to the drains 110 and 112, respectively, of each transistors 102 and 104, respectively. In this configuration, the transistors 102 and 118 form a branch and the transistors 104 and 120 form another branch. A current source 130 is coupled to the common source terminal of the differential pair (102/104) and provides constant bias current through one of the branches in the circuit 100.

With reference still to Prior Art FIG. 1A, when complementary input voltage signals 106 and 108 are received at the gates of the differential pair (102/104), only one branch conducts current to the current source 130. For example, when the transistor 102 receives high input voltage at its gate, it becomes active and draws current through a diode 126. The current causes a drop in voltage at the drain 110 of the active transistor 102. This corresponds to the low voltage (e.g., inverted voltage), which is buffered by an output transistor 132 biased with a current source 140. The output 136 at the source terminal of the output transistor 132 is a low voltage signal. In contrast, transistors 104 and 120 in the other branch are inactive because the low input voltage 108 at the gate of transistor 104 turns off the transistor 104. Accordingly, only a small leakage current flows through the diode 128 and the transistor 104. As a result, the voltage at the drain 112 of transistor 104 is high (e.g., inverted). An output buffer transistor 134 biased with a current source 142 buffers the voltage at the drain 112 of transistor 104. The output 138 at the source terminal of the output transistor 134 is thus a high voltage signal.

It should be appreciated that the same analysis applies similarly when the differential input signals are reversed. For instance, when the transistor 104 receives high input voltage at its gate, the transistor 102 receives low input voltage. This differential voltage generates a high voltage signal at the output 136 at the source terminal of the output transistor 132 and a low voltage signal at the output 138 at the source terminal of the output transistor 134.

Figure 1B:
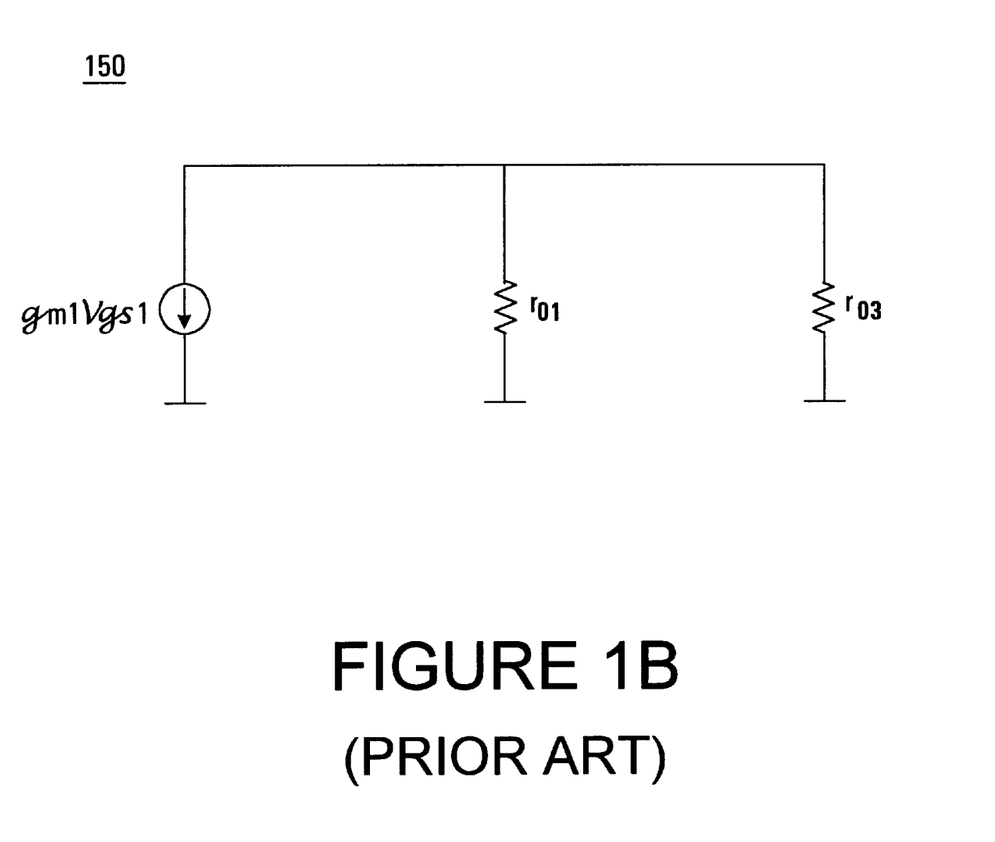
FIG. 1B illustrates the relationship between capacitance at the drain node and currents through transistors for one of the branches in the conventional differential MOS current-mode logic inverter.

One of the drawbacks of the conventional differential MOS current-mode logic inverter 100 is the switching speed. Specifically, the conventional differential MOS current-mode logic inverter 100 cannot accommodate speeds utilized in some of the latest communication devices, which can require MOS logic circuits to operate up to speeds over 1 gigahertz (GHz). Prior Art FIG. 1B illustrates the relationship between capacitance 160 at the drain node 110 and currents $I_1$ and $I_2$ through transistors 102 and 118, respectively. The capacitance 160 is a node capacitance typically associated with a node and may also include parasitic capacitance. The current 12 through the transistor 118 remains constant due to the fixed reference voltage 116 applied at the gate of the transistor 118. In this configuration, when the input voltage 106 at the gate of transistor 102 increases, the voltage at the node 110 decreases and the current $I_1$ through the transistor 102 increases. Conversely, when the input voltage 106 at the gate of the transistor 102 decreases, the voltage at the node 110 increases and the current $I_1$ through the transistor 102 decreases. Since the current 12 is constant in either instances, this current is not discharged efficiently to increase the switching speed of the capacitance 160 at the node 110. This same analysis applies in similar manner to the other branch of the circuit comprising transistors 104 and 120.

Prior Art FIG. 1C illustrates a small signal equivalent circuit 150 for one branch comprised of transistors 102 and 118 excluding the diode 126 in the current-mode logic inverter circuit 100 shown in Prior Art FIG. 1A. The gain for this branch is based on the transistor 102 alone and is proportional to $g_{m1} V_{gs1}$, where $g_{m1}$ (e.g., transconductance of transistor 102) is the ratio of output current to the input voltage for transistor 102 and $V_{gs1}$ is the voltage between the gate and source of the transistor 102. The resistors, $r_{O1}$ and $r_{O2}$, represent output resistance of the transistors 102 and 118, respectively. The complementary MOS transistor 118 does not contribute to the gain because $V_{gs1}$ of the transistor 118 is fixed to a fixed voltage, Vref 116. Hence, the overall small signal gain for the branch is relatively low. It should be appreciated that the same analysis applies similarly to the other branch of the circuit comprising transistors 104 and 120.

The low gain affects the switching speed of the transistors in the current-mode logic circuit. Since $g_m$ is defined as the ratio of output current to the input voltage, it is directly proportional to the output current. If the output current is increased, the gain increases. Typically, inverter circuits have capacitance that allows charging and discharging of currents. When current is increased, the capacitance charges and discharges at a faster rate. Hence, the switching speed increases when gain increases. It would be advantageous to increase the switching speed of circuit 100.

Thus, what is needed is a differential CMOS current-mode logic circuit with higher gain and speed. Accordingly, the present invention satisfies these needs by providing a high speed and gain differential CMOS current-mode logic circuit.

SUMMARY OF THE INVENTION

The present invention provides a differential MOS current-mode logic inverter circuit. In this circuit, a first transistor is coupled to a second transistor at a common source for receiving a differential input signal at the gates of the first and second transistors. The differential input signal turns on one transistor while turning off the other transistor. The gate of first transistor is also coupled to a gate of a first complementary transistor, which has its drain coupled to a drain of the first transistor forming a first common drain node. When the first transistor is turned on by the differential input signal, the current through the first complementary transistor is decreased and when the first transistor is turned off, the current is increased. By thus controlling the current through the first complementary transistor, the present invention increases the gain and the switching speed at the first common drain node and thus the circuit. Similarly, the gate of the second transistor is coupled to a gate of a second complementary transistor, which has its drain coupled to a drain of the first transistor forming a second common drain node. When the second transistor is turned off by the differential input signal, the current through the second complementary transistor is increased and when the transistor is turned on, the current is decreased. By controlling the current through the second complementary transistor in this manner, the present invention increases the gain and the switching speed at the second common drain node and the circuit as well. The circuit of the present invention also includes a first diode and a second diode coupled to limit the voltages at the first and second common drain nodes, respectively. These diodes provides a current path for a bias current. In addition, the present invention includes a first current source coupled to the common source of the first and second transistors to provide the bias current to the first and second transistors. In this configuration, a first output signal is generated at the first common drain node and a second output signal is generated at the second common drain node.

In the circuit of the present invention, when one of the transistors in the differential pair turns on in response to input voltages, the first current source draws the bias current through the "on" transistor and the associated diode. In this manner, a first output voltage is generated at the first common drain and a second output voltage is generated at the second common drain. The first output voltage is complementary to the first input voltage and the second output voltage. Likewise, the second output voltage is complementary to the second input voltage and the first output voltage. Since the gates of the first and second transistors receive a differential input signal, the voltages between the gate and the source, Vgs, for these transistors are not fixed. As a result, the gain of the CMOS current-mode logic structure of the present invention is increased. In addition, because the first and second complementary transistors have identical input voltages as their associated first and second transistors, the current through the first and second complementary transistors is reduced when discharging and is increased and charging. In this manner, the capacitance at the drain nodes of differential pair transistors is charged and discharged at a faster rate, resulting in a faster switching speed for the circuit.

BRIEF DESCRIPTION OF THE DRAWINGS

The accompanying drawings, which are incorporated in and form a part of this specification, illustrate embodiments of the invention and, together with the description, serve to explain the principles of the invention:

Prior Art

Prior Art

Prior Art FIG. 1C illustrates a small signal equivalent circuit for one of the branches in the conventional differential MOS current-mode logic inverter.

DESCRIPTION OF THE PREFERRED EMBODIMENTS

A high speed and gain differential MOS current-mode logic circuit is disclosed. In the following detailed description of the present invention, numerous specific details are set forth in order to provide a thorough understanding of the present invention. However, it will be obvious to one skilled in the art that the present invention may be practiced without these specific details. In other instances, well known methods, procedures, components, and circuits have not been described in detail so as not to unnecessarily obscure aspects of the present invention.

The differential MOS current-mode logic circuit of the present invention utilizes MOS field-effect-transistors (FET). As is well known in the art, MOSFETs are classified into two types: n-type and p-type. A MOSFET has four terminals: gate, drain, source, and body. In the present invention, two MOSFETs are coupled at the source to form a differential pair. One of the distinct characteristics of a differential MOS current-mode logic inverter is the steering of currents between the branches defined by the transistors in the differential pair. The MOS differential pair is first biased with a constant current source. The current-mode inverter then operates by steering the bias current to only one side of the differential pair depending on the polarity of the differential input voltage. This steering of the bias current is the basis for the switching mechanism used in conventional current-mode inverters and reduces much of the noise prevalent in conventional voltage-mode switching mechanisms.

The present invention utilizes the steering mechanism of the current-mode as illustrated in FIG. 2A, which shows a circuit schematic for a differential MOS current-mode logic inverter 200 in accordance with the present invention. A differential input pair is comprised of two n-type MOS transistors 202 and 204. The differential pair (202/204) receives complementary input voltage signals 206 and 208 at the gates of transistors 202 and 204, respectively. The input voltage signal 206 at the gate of the transistor 202 is complementary to the input voltage signal 208 at the gate of the transistor 204. That is, when one input voltage at a gate in the differential pair is low, the other input voltage at the other gate is high. Conversely, when one is high, the other is low. This allows only one of the differential pair transistors 202 and 204 to be turned on at a given time, which means that only one branch conducts current at a time.

With reference to FIG. 2A, a pair of complementary p-type MOS transistors 220 and 222 act as active load for the differential pair. The drain of the transistor 220 is coupled to the drain of the transistor 202. Similarly, the drain of the transistor 222 is coupled to the drain of the transistor 204. The gates of the complementary p-type MOS transistors 220 and 222 are coupled to the gates of the associated transistors 202 and 204, respectively. This allows same input signals to be received at the gates of the coupled transistors. In this configuration, the transistors 202 and 220 form a first branch and the transistors 204 and 220 form a second branch. These branches are optionally provided with a pair of diodes 226 and 228 to limit the voltage at the drains 210 and 212 of the transistors 202, 204, 220, and 222. The diodes 226 and 228 are each coupled between Vdd 224 and the source terminals of the transistors 220 and 222, respectively. The diodes 226 and 228 also provide a current path for the branches from Vdd 224 to the differential pair transistors 206 and 208. In one embodiment, the diodes can readily be implemented using an MOS transistor of either p-type or n-type by diode connecting the terminals of the MOS transistor. In other words, the gate and the drain of an MOS transistor can be coupled to each other to function as a diode. Other well known configurations can also be used to implement the diodes 226 and 228.

A bias current source 230 (e.g., constant current source) provides a constant bias current through one of the two branches of circuit 200 depending on inputs at the gates of the transistors 202 and 204. The bias current source 230 makes the voltages between the gate and source, Vgs, of differential pair transistors 202 and 204, approximately constant. This, in turn, reduces nonlinearities in the transistors 202 and 204.

The inverter circuit 200 of the present invention in FIG. 2A operates by receiving complementary input voltage signals 206 and 208. The input voltage signals 206 and 208 are then inverted at the drains 210 and 212 and the outputs 236 and 238. When the complementary input voltage signals 206 and 208 are received at the gates of the transistors 202 and 204, only one branch conducts current biased by the current source 230. For example, the transistor 202 of the first branch receives a high input voltage signal at its gate, it becomes active (e.g., "on") and draws current through the diode 226. The current causes a drop in voltage at the drain 210 of the transistor 202. The voltage drop results in a low voltage at the drain 210, which is buffered by an output transistor 232 biased with a first current source 240 to produce a low voltage at the output 236 taken at the source terminal of the output transistor 232.

In contrast, the second branch is inactive because the low input voltage signal 208 at the gate of transistor 204 turns off the transistor 204. Only a small leakage current flows through the transistor 204 and the diode 228. As a result, the voltage at the drain 212 of transistor 204 is high (e.g., inverted). An output buffer transistor 234 biased with a current source 242 buffers the voltage at the drain 212 of transistor 204. Thus, the output 238 at the source terminal of the output transistor 234 is a high voltage signal.

The current sources 240 and 242 stabilize Vgs of transistors 232 and 234, respectively, to reduce their nonlinear characteristics. The current sources 230, 232, and 234 counteract the switching effects of the transistors to provide a constant current. In one embodiment, the current sources 230, 232, and 234 of the present invention can be implemented with MOS or bipolar junction transistors and are well known in the art. It should be appreciated that the physical characteristics of the following pairs of MOS transistors are designed to match to ensure stability and performance in the present inverter circuit: transistors 202 and 204, transistors 218 and 220, and transistors 232 and 234. In addition, it should be recognized that the present invention can be implemented with the types of MOS transistors reversed. That is, the differential MOS pair transistors 202 and 204 may be implemented as p-type transistors while the complementary MOS transistors 220 and 222 can be implemented as n-type transistors.

FIG. 2B illustrates the relationship between capacitance 260 at the 25 common drain node 210 and currents $I_1$ and $I_2$ through transistors 202 and 220, respectively, for one of the branches in the differential MOS current-mode logic inverter 200. The capacitance 260 is a node capacitance typically associated with a node and may also include parasitic capacitance. In conventional current-mode logic circuits, the current through the complementary transistor remained constant due to a fixed reference voltage at its gate. In the present invention however, the current $I_2$ through the transistor 220 changes to assist charging and discharging of the capacitance 260 at the common drain node 210. Specifically, the voltage at the gate of the complementary transistor 220 is no longer fixed because the gate of the complementary transistor 220 is coupled to receive the same input signal 206 as the transistor 202. In this configuration, when the input voltage 206 at the gate of the transistor 102 increases (e.g., on, high, etc.), the voltage between the gate and source of the transistor 202 increases, which forces current $I_1$ to flow through the transistor 202. At the same time, the same increase in the input voltage 206 decreases the current $I_2$ in the complementary transistor. Hence, both currents $I_1$ and $I_2$ draw current away from the common drain node 210 and its associated capacitance 260. As a result, the charges at the common drain node is discharged faster than in the conventional current-mode logic circuits.

Conversely, when the input voltage 206 at the gate of the transistor 102 decreases (e.g., off, low, etc.), the voltage between the gate and source of the transistor 202 decreases, which forces less current $I_1$ to flow through the transistor 202. At the same time, the same input voltage 206 turns on the complementary transistor 220, which forces the current $I_2$ to flow. Hence, both currents $I_1$ and $I_2$ help to charge the common drain node 210 and its associated capacitance 260. As a result, the charges at the common drain node is charged faster than in the conventional current-mode logic circuits. The faster charging and discharging of the common drain node leads to a faster switching transistors and circuit in the present invention. This same analysis applies in similar manner to the other branch of the circuit comprising transistors 204 and 222.

Figure 2:
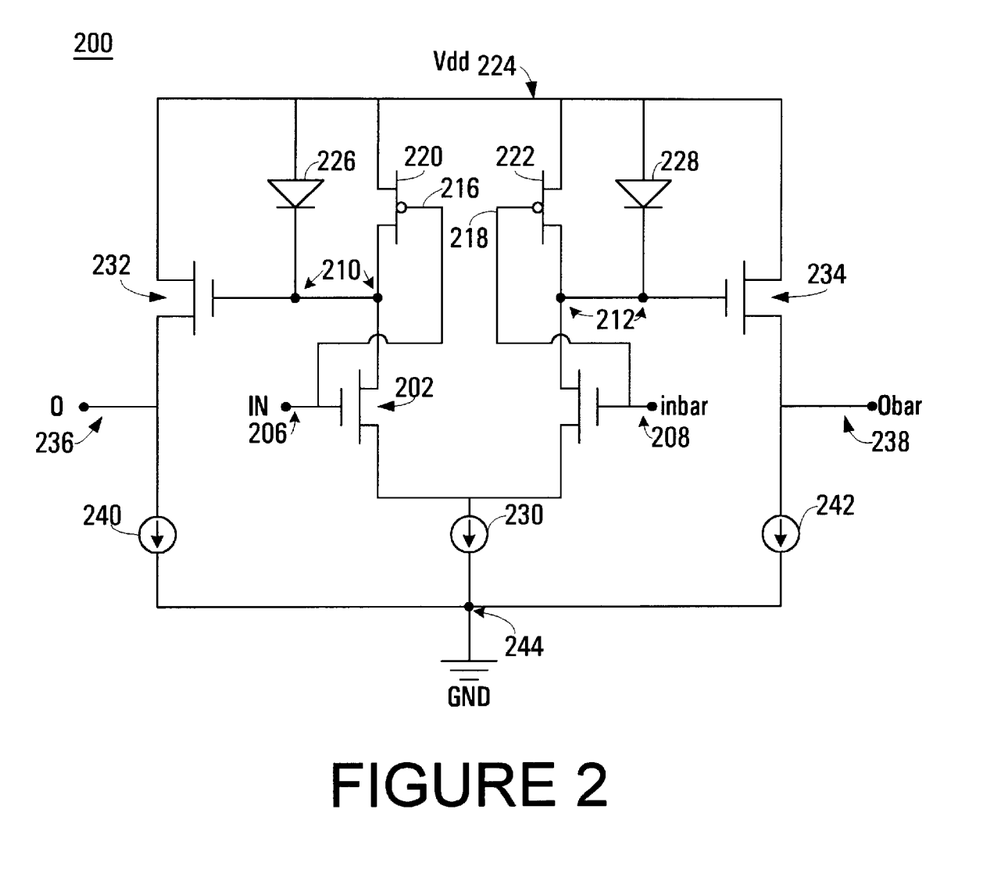
FIG. 2A illustrates a circuit schematic for a high gain and fast speed differential MOS current-mode logic inverter in accordance with the present invention.
FIG. 2B illustrates the relationship between capacitance at a common drain node and currents through transistors for one of the branches in the differential MOS current-mode logic inverter of the present invention.
Figure 3:
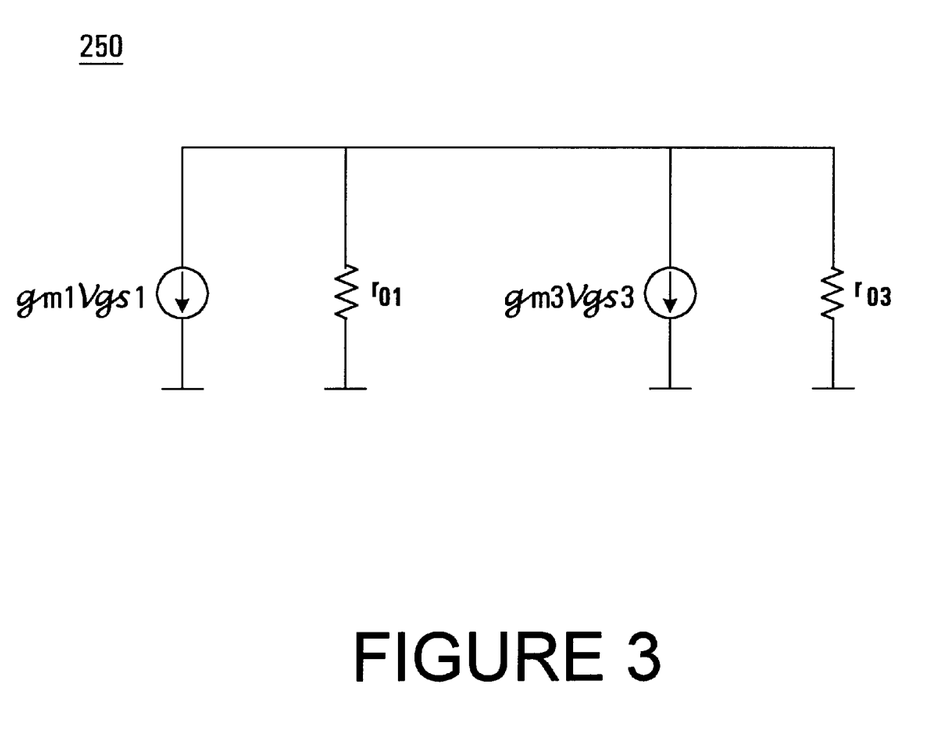
FIG. 3 illustrates a small signal equivalent circuit for the MOS current-mode logic inverter of the present invention.

FIG. 3 illustrates a small signal equivalent circuit 250 for one branch of the MOS current-mode logic inverter circuit 200 depicted in FIG. 2. In the present circuit, unlike typical conventional MOS current-mode circuit, the gain for the branch comprised of transistors 202 and 220 includes contributions from both transistors 202 and 220 and is proportional to the sum of $g_{m1}V_{gs1}$ and $g_{m3}V_{gs3}$, where $g_{m1}$ and $gm_3$ are the ratio of output current to the input voltage for transistors 202 and 220, respectively, and $V_{gs1}$ and $V_{gs3}$ are the voltage between the gate and source of the transistors 202 and 220, respectively. Since the gates of transistors 202 and 220 are coupled together, $V_{gs1}$ and $V_{gs3}$ are not fixed. Instead, $V_{gs1}$ and $V_{gs3}$ vary as the input voltage at the gates are varied. Therefore, in accordance with the present invention, the overall gain is larger than in conventional circuits due to factor of $g_{m3}V_{gs3}$ added for the transistor 220. It should be noted that the same analysis applies to the other branch of the circuit comprising transistors 204 and 212.

Figure 4A:
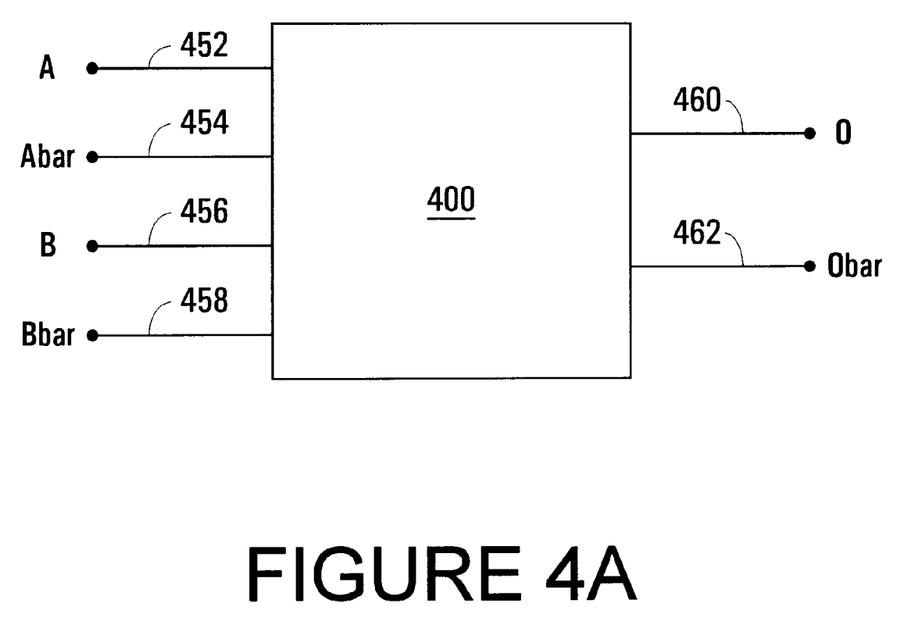
FIG. 4A illustrates a simplified logic diagram for a gate structure that combines the logic functions of AND, NAND, OR, and NOR gates.

The differential MOS current-mode logic circuit of the present invention can be used to implement logic functions. FIG. 4A illustrates a simplified logic schematic for a gate structure 400 that combines the logic functions of AND, NAND, OR, and NOR gates. The gate structure 400 receives two pairs of complementary voltage signals, namely, A 452 and Abar 54, and B 456 and Bbar 458. Abar 454 is the inversion of A 452 and Bbar 458 is he inversion of B 456. The gate structure 400 generates O 460 and Obar 462 as outputs. Obar 462 is the inversion of signal O 460. The logic function of an AND gate is produced by selecting A 452 and B 456 as inputs and taking the O 460 as the output. The logic function of a NAND gate is generated by selecting the same inputs as the AND gate, but with the output from Obar 462. On the other hand, the logic function of an OR gate is realized by selecting Abar 454 and Bbar 458 as inputs and Obar 462 as the output. The logic function of a NOR gate is produced by selecting an output from O 460 with the same inputs as the OR gate. These configurations are summarized in Table 1 below.

TABLE 1

| Logic Circuit | Inputs | Output |
| --- | --- | --- |
| AND | A, B | O |
| NAND | A, B | Obar |
| OR | Abar, Bbar | Obar |
| NOR | Abar, Bbar | O |

Figure 4B:
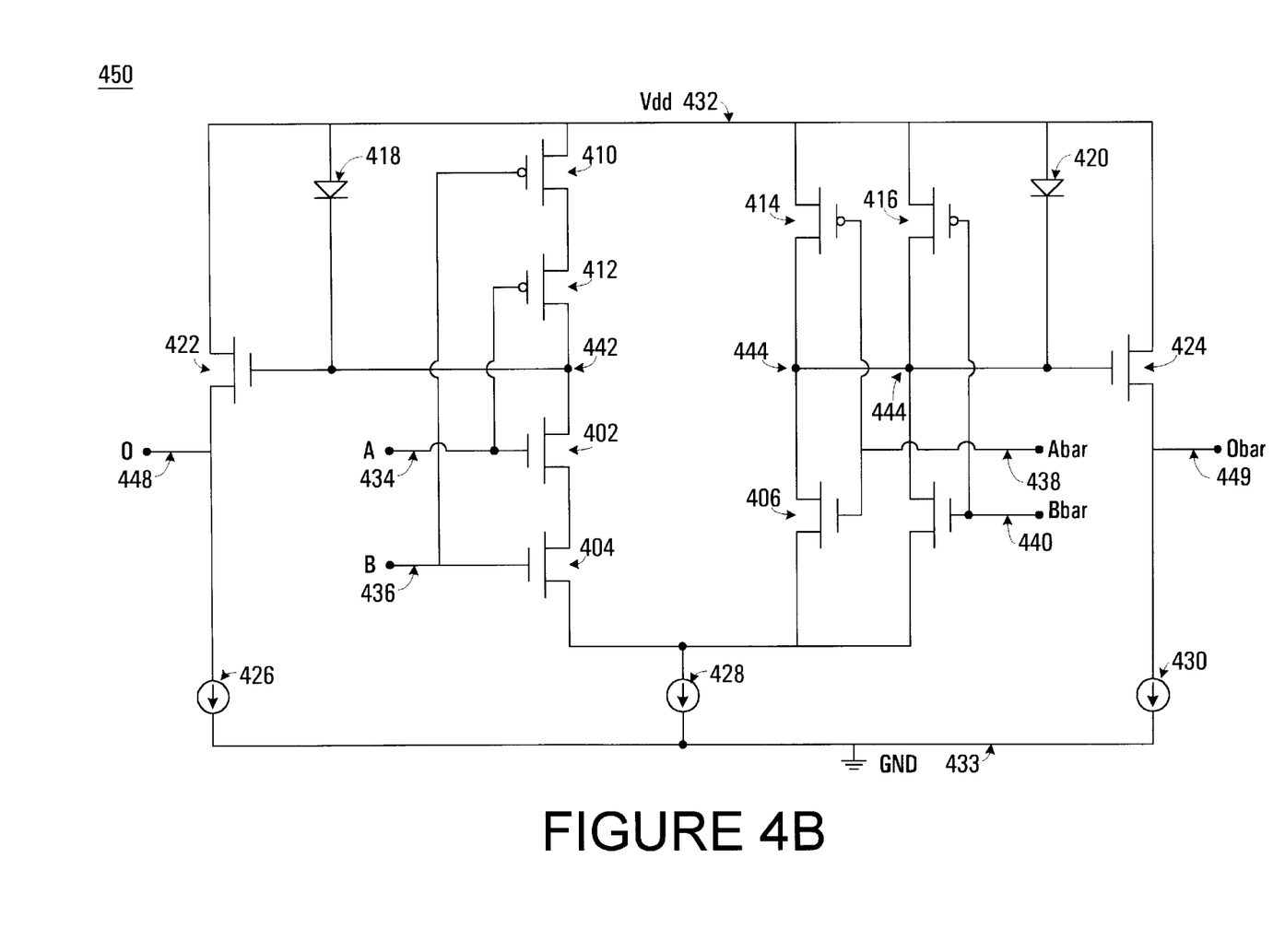
FIG. 4B illustrates an exemplary circuit structure in accordance with the present invention that can be used to implement AND, NAND, OR, and NOR gate functions.

One embodiment of the present invention implements the gate structure 400 combining these logic functions. FIG. 4B illustrates an exemplary circuit structure 450 implementing AND, NAND, OR, and NOR gate functions. The circuit 450 adds a differential pair comprised of a pair of MOS transistors 404 and 408 and a pair of complementary MOS transistors 410 and 416 to the inverter circuit 200 illustrated in FIG. 2. The inputs A 452 and Abar 454 in FIG. 4A correspond to input voltage signals 436 and 438, respectively, in FIG. 4B while the inputs B 456 and Bbar 458 correspond to input voltage signals 436 and 440, respectively. Similarly, the outputs O and Obar correspond to outputs 448 and 449, respectively.

With reference to FIG. 4B, on one side of the branch comprising MOS transistors 402, 404, 410, and 412, the MOS transistor 404 is coupled between the source of the transistor 402 and a current source 428 in series. The transistor 410 is coupled between Vdd 432 and the transistor 412. The gate of transistor 404 is coupled to the gate of transistor 410. On the other side of the branch comprising transistors 406, 408, 414, and 416, the MOS transistor 408 is coupled to the source of the transistor 406 at their drains and sources. The transistor 408 and the complementary transistor 416 are coupled to each other at their drains and gates. The complementary transistor 416 is coupled to Vdd 432 at its source terminal.

In FIG. 4B, an AND gate function is implemented by having two n-type MOS transistors 402 and 404 in series and their corresponding complementary load transistors 412 and 410, respectively, in series as shown in FIG. 4B. When an input to either transistors 402 and 404 is low, current does not flow in the branch. Hence, the output voltage at O 448 buffered from the drain 442 of transistor 402 through a first output buffer 422 is high. Current will flow through the branch only when both inputs to transistors 402 and 404 are high. Then, the output voltage at O 448 will be low. The NAND gate function is implemented in similar manner as the AND gate except the output is taken from the Obar 449 instead of the output at O 448.

The gate structure 450 of FIG. 4B in the present invention implements an OR gate function by having two n-type MOS transistors 406 and 408 in parallel and their corresponding complementary load transistors 414 and 416, respectively, in parallel. When the input to either transistors 406 and 408 is high, current flows through the transistor with the high input. This current forces the voltage at the drain 444 to be low. It should be noted that the drains of the transistors 406 and 408 are coupled to each other at the drain 444. The voltage at the drain 444 is then buffered through a second output buffer 424 and is outputted at the Obar 449 as low. However, when both inputs to the transistors 406 and 408 are low, no current flows through either transistors 406 and 408. Hence, the voltage at the drain 444 becomes high and the voltage at the Obar 449 is high. In short, when the input to either transistors 406 and 408 is high, the output voltage is low. Otherwise, the output voltage is high. This is the OR gate function. Similarly, the NOR gate function is implemented in the same way except the output is taken from the output 0 448 instead of the Obar 449.

The present invention, differential MOS current-mode logic circuit, is thus described. While the present invention has been described in particular embodiments, it should be appreciated that the present invention should not be construed as being limited by such embodiments, but rather construed according to the claims below.

What is claimed is:

1. A differential MOS current-mode logic circuit comprising:

a first transistor coupled to a second transistor at a common source, wherein a differential input signal is applied to the gates of the first and second transistors such that when one transistor is on, the other transistor is off;

a first complementary transistor having a gate coupled to the gate of the first transistor and having a drain coupled to a drain of the first transistor forming a first common drain node wherein a first current through the first complementary transistor is decreased when the first transistor is on and is increased when the first transistor is off so as to increase the gain and the switching speed at the first common node;

a second complementary transistor having a gate coupled to the gate of the second transistor and having a drain coupled to a drain of the first transistor forming a second common drain node wherein a second current through the second complementary transistor is decreased when the second transistor is on and is increased when the second transistor is off so as to increase the gain and the switching speed at the second common node;

a first diode and a second diode coupled to limit the voltages at the first and second common drain nodes, respectively, wherein the first and second diodes provides a current path for a bias current;

a first current source coupled to the common source of the first and second transistors to provide a bias current to the first and second transistors wherein a first output signal is generated at the first common drain node and a second output signal is generated at the second common drain node;

third and fourth transistors coupled in parallel and having a first common node coupled to said first common current source and having a second common node coupled to supply a second output signal wherein a gate of said third transistor is coupled to a third input signal and a gate of said fourth transistor is coupled to a fourth input signal; and third and fourth complementary transistors coupled together in parallel and coupled between said second common node of said third and fourth transistors and said supply voltage wherein a gate of said third complementary transistor is coupled to said gate of said third transistor and wherein a gate of said fourth complementary transistor is coupled to said gate of said fourth transistor.

2. The circuit as recited in claim 1 wherein the differential input signal comprises a first input signal applied to the gate of the first transistor and a second input signal applied to the gate of the second transistor.

3. The circuit as recited in claim 1 wherein the first diode provides a current path for the bias current when the first transistor is turned on by the differential input signal.

4. The circuit as recited in claim 1 wherein the second diode provides a current path for the bias current when the first transistor is turned on by the differential input signal.

5. The circuit as recited in claim 1 wherein the first and second transistors are metal-oxide semiconductor (MOS) transistors and wherein the first and second complementary transistors are metal-oxide semiconductor (MOS) transistors.

6. The circuit as recited in claim 1 further comprising:

a first output transistor coupled to a source and the drain of the first complementary transistor for buffering the first output signal at the first common drain node of the first transistor and for generating a first buffered output signal;

a second output transistor coupled to a source and the drain of the second complementary transistor for buffering the second output signal at the second common drain node and for generating a second buffered output signal;

a second current source coupled to the first output transistor for providing a constant current to the first output transistor; and a third current source coupled to the second output transistor for providing a constant current to the second output transistor.

7. The circuit as recited in claim 6 wherein the first transistor and the second transistor are both n-type MOSFETs.

8. The circuit as recited in claim 7 wherein the first complementary transistor and the second complementary transistor are both p-type MOSFETs.

9. The circuit as recited in claim 6 wherein the first transistor and the second transistor are both p-type MOSFETs and wherein the first complementary transistor and the second complementary transistor are both n-type MOSFETs.

10. The circuit as recited in claim 6 wherein the first output transistor and the second output transistor are both n-type MOSFETs and wherein the first output transistor and the second output transistor are both p-type MOSFETs.

11. The circuit as recited in claim 1 wherein the first diode and the second diode are both diode coupled MOSFETs.

12. A differential MOS current-mode logic circuit comprising:

first and second transistors coupled in series wherein said second transistor is coupled to a first common current source which is coupled to ground wherein a gate of said first transistor is coupled to a first input signal and a gate of said second transistor is coupled to a second input signal;

first and second complementary transistors coupled together in series and coupled between said first and second transistors and a supply voltage wherein a gate of said first complementary transistor is coupled to said gate of said first transistor and wherein a gate of said second complementary transistor is coupled to said gate of said second transistor and wherein a first output signal is taken between said second complementary transistor and said first transistor;

third and fourth transistors coupled in parallel and having a first common node coupled to said first common current source and having a second common node coupled to supply a second output signal wherein a gate of said third transistor is coupled to a third input signal and a gate of said fourth transistor is coupled to a fourth input signal; and third and fourth complementary transistors coupled together in parallel and coupled between said second common node of said third and fourth transistors and said supply voltage wherein a gate of said third complementary transistor is coupled to said gate of said third transistor and wherein a gate of said fourth complementary transistor is coupled to said gate of said fourth transistor.

13. The circuit as recited in claim 12 wherein said first, second, third and fourth complementary transistors are p-type MOSFETs and wherein said first, second, third and fourth transistors are n-type MOSFETs.

14. The circuit as recited in claim 12 wherein the circuit implements an AND gate function by selecting the first input signal and the third input signal as AND gate inputs and by selecting the first output signal as the AND gate output.

15. The circuit as recited in claim 12 wherein the circuit implements an NAND gate function by selecting the first input signal and the third input signal as NAND gate inputs and by selecting the second output signal as the NAND gate output.

16. The circuit as recited in claim 12 wherein the circuit implements an OR gate function by selecting the second input signal and the fourth input signal as OR gate inputs and by selecting the second output signal as the OR gate output.

17. The circuit as recited in claim 12 wherein the circuit implements an NOR gate function by selecting the second input signal and the fourth input signal as NOR gate inputs and by selecting the first output signal as the NOR gate output.

18. The circuit as recited in claim 12 further comprising:

a first output transistor having a source coupled to said supply voltage and a drain coupled to a second current source which is coupled to ground, said first output transistor having a gate coupled to said first output signal and for supplying a first output buffered signal; and a second output transistor having a source coupled to said supply voltage and a drain coupled to a third current source which is coupled to ground, said second output transistor having a gate coupled to said second output signal and for supplying a second output buffered signal.

19. The circuit as recited in claim 18 further comprising:

a first diode coupled between said gate of said first output transistor and said supply voltage; and a second diode coupled between said gate of said second output transistor and said supply voltage.

* * * * *